United States Patent

Sulten et al.

[11] Patent Number: 5,873,158
[45] Date of Patent: Feb. 23, 1999

[54] METHOD OF MANUFACTURING A MULTIFILAMENT SUPERCONDUCTOR WITH RESISTIVE BARRIER INTEGRATED INTO THE OUTER RING

[75] Inventors: Philippe Sulten, Evette-Salbert; Christian Eric Bruzek, Belfort; Giaky Hoang, Cravanche, all of France

[73] Assignee: Gec Alsthom Electromecanique SA, Paris, France

[21] Appl. No.: 679,721

[22] Filed: Jul. 12, 1996

[30] Foreign Application Priority Data

Jul. 13, 1995 [FR] France .................................. 95 08571

[51] Int. Cl.$^6$ .................................................. H01L 39/24
[52] U.S. Cl. .......................... 29/599; 505/917; 505/927; 505/928; 505/930
[58] Field of Search .............................. 29/599; 505/927, 505/928, 930, 917

[56] References Cited

U.S. PATENT DOCUMENTS 3,625,662  12/1971  Roberts et al. ...................... 29/599 X
3,930,903   1/1976  Randall et al. ...................... 29/599 X
3,954,572   5/1976  Ziegler et al. ....................... 29/599 X
3,958,327   5/1976  Marancik et al. ...................... 29/599
4,148,129   4/1979  Young ................................. 29/599
5,088,183   2/1992  Kanithi .............................. 29/599
5,182,176   1/1993  Wong ............................... 29/599 X

FOREIGN PATENT DOCUMENTS 0124708  11/1984  European Pat. Off. .
2054392   5/1972  Germany ........................... 29/599
2003766   3/1979  United Kingdom .................. 29/599
9113468   9/1991  WIPO ............................... 29/599

*Primary Examiner*—Carl J. Arbes
*Attorney, Agent, or Firm*—Sughrue, Mion, Zinn, Macpeak & Seas, PLLC

[57] ABSTRACT

The invention concerns a method of making a superconductor so that it includes, in cross-section: a central area, made up of a plurality of superconductor filaments of the NbTi, NbTiTa type or of any other alloy or substance based on Nb; a concentric, two part, outer ring surrounding the central area; and a concentric resistive barrier. In accordance with the invention, the concentric resistive barrier is integrated into the concentric outer ring.

14 Claims, 1 Drawing Sheet

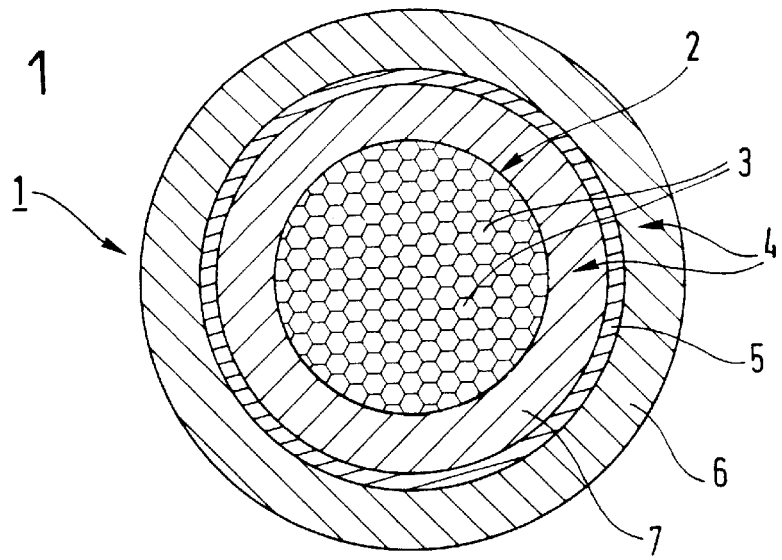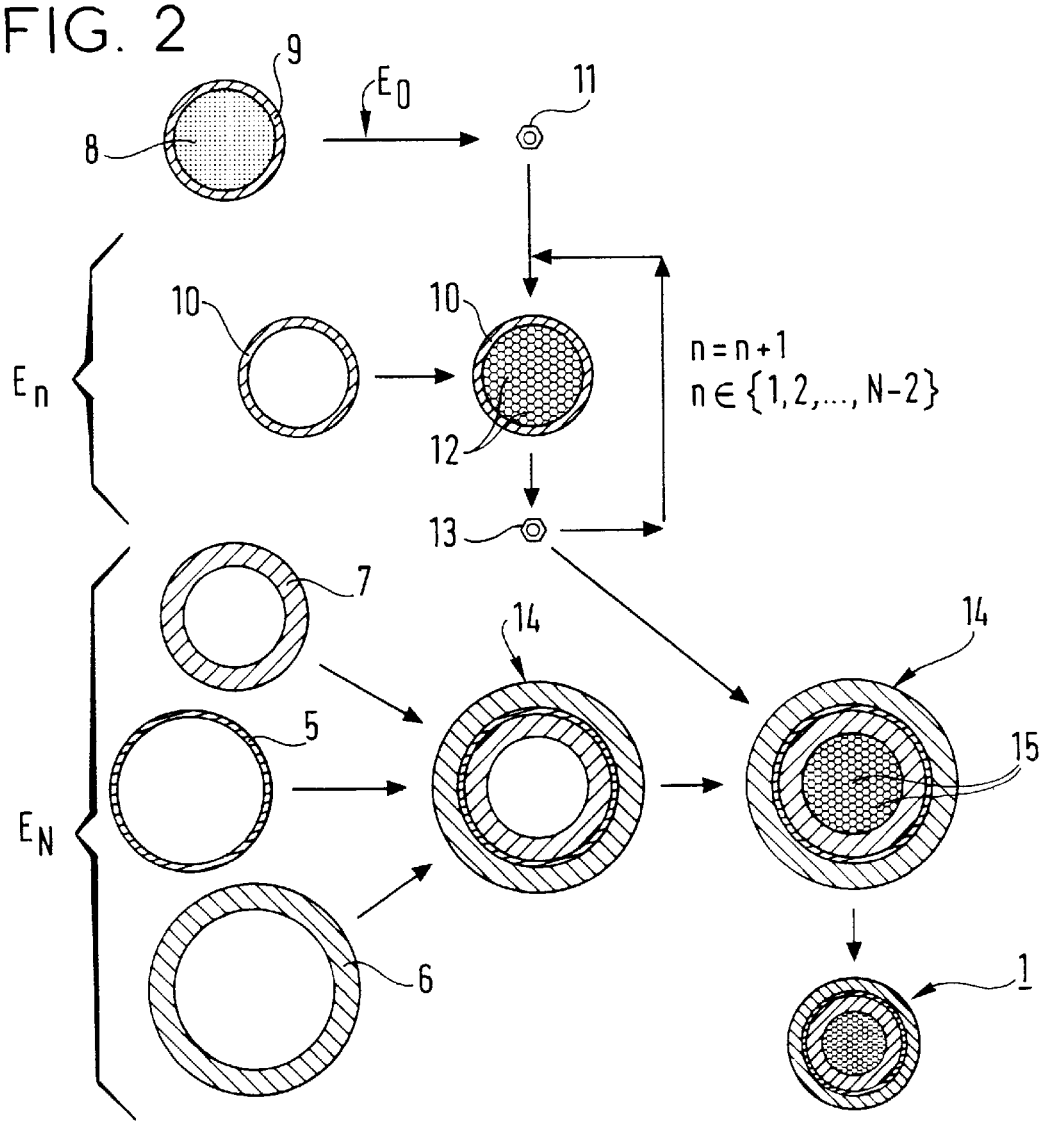

METHOD OF MANUFACTURING A MULTIFILAMENT SUPERCONDUCTOR WITH RESISTIVE BARRIER INTEGRATED INTO THE OUTER RING

The invention concerns a multifilament superconductor with resistive barrier integrated into the outer ring, a cable comprising a conductor of this kind and a method of manufacturing a conductor of this kind.

The present invention is more particularly concerned with:
 a multifilament superconductor comprising, in cross-section, a central area made up of a plurality of superconductor filaments, a concentric outer ring surrounding said central area and a concentric resistive barrier;
 a cable comprising a conductor of this kind; and
 a method of manufacturing a conductor of this kind.

The resistive barrier is designed to limit electric coupling between the superconductor filaments of one superconductor and between the superconductors assembled into a cable. Electrical coupling of this kind causes Joule effect losses leading to heating of the superconductors of the cable and therefore to increased cryogenic consumption.

It is therefore important to provide the superconductors with resistive barriers to limit coupling and therefore heating in the cable. This limits cryogenic consumption and therefore the cost of operating the machine using the superconductor cables.

There are many methods available for manufacturing a multifilament superconductor. These include multistage methods of billeting and drawing a bar of superconductor material surrounded with copper.

The composite bar is drawn a first time, after which a hollow copper cylinder is filled with rods obtained from the drawn composite bar, after which the cylinder is closed and evacuated, after which the billet obtained in this way is drawn to produce a multifilament superconductor. In the subsequent stages of the method the operations carried out on the drawn composite bar are repeated on the multifilament superconductor.

When a multifilament superconductor is obtained containing the number of filaments required to fill the billet of the final stage, the final stage entails reducing the superconductor to the required size.

A hollow cylinder made of the material of the outer ring (for example, copper) is filled with the multifilament rods, closed and evacuated, after which the billet obtained in this way is drawn to the required size of the superconductor with outer ring.

In another phase an outer layer of Cr or Ni or Sn or any other metal that can constitute the resistive barrier of the superconductor is deposited around the superconductor obtained in this way.

Methods of applying this deposit including dipping of the superconductor and electrolytic deposition.

Such methods have drawbacks:

Available space drawbacks in that they require an additional workshop dedicated to the manufacture of the resistive barrier.

Drawbacks connected with the unit cost, partly because of the need for the additional workshop and partly because of the high cost of the materials from which said barriers are made.

Technological drawbacks associated with the deposition of the resistive barrier. There is a limit on the thickness of the resistive barrier below which it is subject to covering defects (absence of material or fragile barrier).

Such barriers reduce losses between superconductors but have little effect of losses between filaments within the same superconductor.

One aim of the present invention is to propose a multifilament superconductor having a barrier integrated into the outer ring. The position of the barrier in the outer ring, its thickness and its nature make it possible to control the losses between filaments and the losses between superconductors and to reach an optimum compromise in respect of the total losses. Additionally, the thickness and the nature of the barrier enable the residual resistance ratio (RRR) of the outer ring to be varied.

Another aim of the present invention is to propose a multifilament superconductor with resistive barrier that does not require any workshop additional to the conventional drawing workshops.

Another aim of the present invention is to propose a multifilament superconductor having a resistive barrier with no limit on its thickness.

Another object of the present invention is to propose a method of manufacturing a multifilament superconductor with resistive barrier that is more economic than the prior art method.

To this end the invention concerns a superconductor comprising, in cross-section, a central area made up of a plurality of superconductor filaments of the NbTi, NbTiTa type or of any other alloy or substance based on Nb, a concentric outer ring surrounding said central area and a concentric resistive barrier. In accordance with the invention said concentric resistive barrier is integrated into the concentric copper outer ring.

In one embodiment the concentric resistive barrier is of cupronickel, cupromanganese or any other resistive metal compatible with the nature of the outer ring.

The invention also concerns a superconductor cable comprising a plurality of superconductors as defined hereinabove braided or twisted together.

The superconductors braided or twisted together form a transposed stranded cable.

Finally, the invention concerns a method of manufacturing a superconductor with copper outer ring in N drawing stages comprising N–1 successive billeting and drawing stages to manufacture a multifilament superconductor of the NbTi or NbTiTa type or of any other alloy or substance based on Nb.

A composite bar comprising a bar of the NbTi or NbTiTa type or of any other alloy or substance based on Nb surrounded by copper is drawn a first time, after which a hollow copper cylinder is filled with rods obtained from the drawn composite bar, after which the cylinder is closed and evacuated, after which the billet obtained in this way is drawn into a multifilament superconductor. In the subsequent stages the operations carried out on the drawn composite bar are repeated on the multifilament superconductor.

In accordance with the invention, the method comprises a final Nth stage in which the superconductor is formed to its final dimension, in which:
 a distal hollow cylinder made from the material of the outer ring is disposed coaxially with an intermediate hollow cylinder made from the material of the resistive barrier and a proximal hollow cylinder made from the material of the outer ring to constitute a composite hollow cylinder;
 said composite hollow cylinder is filled in an ordered manner with the multifilament superconductor rods obtained from the (N–1)th stage of the method to form a billet;

the ends of the billet are closed and the interior of the billet is evacuated;

the billet is drawn to the required diameter of the superconductor.

The thicknesses of the hollow cylinders are chosen so that, after drawing, the superconductor has a resistive barrier with a predetermined thickness and a predetermined location in the outer ring.

The thicknesses chosen depends on a predetermined ratio between the losses between the superconductors and the losses between the filaments.

The thicknesses chosen may also depends on a predetermined residual resistance ratio (RRR).

One advantage of the present invention results from the fact that the workshops for drawing the multifilament superconductor can be used to manufacture the resistive barrier of the superconductors in accordance with the invention.

Another advantage of the present invention results from the fact that the thickness of the resistive barrier is controlled better than in the prior art, and this thickness can be less than the lower limit on the thickness of the prior art barriers.

Another advantage of the present invention results from the use of cupronickel, cupromanganese or any other resistive metal compatible with the nature of the outer ring as the material of the resistive barrier. These materials are much less costly than the chromium or the nickel used in the prior art.

Other advantages and features of the present invention will be apparent from the following description given with reference to the appended drawings, in which:

FIG. 1 is a diagrammatic representation in cross-section of a multifilament superconductor of the invention with an integrated resistive barrier in the outer ring.

FIG. 2 is a diagram showing the stages of the method of the invention of manufacturing a multifilament superconductor with a resistive barrier integrated in the outer ring.

The invention concerns a superconductor 1 comprising, in cross-section, a central area 2 made up of a plurality of superconductor filaments 3 of the NbTi, NbTiTa type or of any other alloy or substance based on Nb, a concentric outer ring 4 surrounding said central area and a concentric resistive barrier 5.

In accordance with the invention, the concentric outer ring 4 comprises a distal ring 6 and a proximal ring 7 with the concentric resistive barrier 5 between them.

Thus, in accordance with the invention, the concentric resistive barrier 5 is integrated into the copper concentric outer ring 4.

The concentric resistive barrier 5 is advantageously of cupronickel, cupromanganese or any other resistive metal compatible with the nature of the outer ring 4.

The invention also concerns a superconductor cable (not shown) comprising a plurality of superconductors 1 braided or twisted together.

The superconductors 1 which are braided or twisted together advantageously form a transposed stranded cable.

Finally, the invention concerns a method of manufacturing a superconductor 1 with a copper outer ring 4 in N drawing stages comprising N–1 successive stages of billeting and drawing to manufacture the multifilament superconductor 3 of the NbTi or NbTiTa type or of any other alloy or substance based on Nb and an Nth stage of forming the superconductor to the final size.

During the N–1 stages:

a composite bar comprising a bar 8 of NbTi or NbTiTa or any other alloy or substance based on Nb surrounded with copper 9 is drawn a first time ($E_0$), after which a hollow copper cylinder 10 is filled with rods 12 obtained from the drawn composite bar 11 ($E_1$), after which the cylinder is closed and evacuated, after which the billet obtained in this way is drawn to produce a multifilament superconductor 13. In a stage $E_n$ where n varies from 2 to N–1, the operations of stage $E_1$ are repeated on the multifilament superconductor obtained in stage $E_{n-1}$.

In stage N:

a distal hollow cylinder 6 made from the material of the outer ring is disposed coaxially with an intermediate hollow cylinder 5 made from the material of the resistive barrier and a proximal hollow cylinder 7 made from the material of the outer ring to constitute a composite hollow cylinder 14;

said composite hollow cylinder 14 is filled in an ordered manner with rods 15 obtained from the multifilament superconductor 13 obtained from stages N–1, the method to form a billet;

the ends of the billet are closed and the interior of the billet is evacuated;

the billet is drawn to the required diameter of the superconductor 1.

The multifilament superconductors are advantageously drawn in a die having an appropriate shape to facilitate the filling of the billets. For example, the cross-section shape may be hexagonal to facilitate the filling of the billets.

In this method the thicknesses of the hollow cylinders 5, 6, 7 are chosen so that, after drawing, the superconductor 1 has a resistive barrier having a predetermined thickness and a predetermined location in the outer ring 4.

The thicknesses of the hollow cylinder 5, 6, 7 and the material of the resistive barrier are advantageously chosen to obtain a predetermined ratio between the losses between the superconductors and the losses between the filaments.

The thicknesses of the hollow cylinders 5, 6, 7 and the material of the resistive barrier are advantageously chosen to obtain a predetermined residual resistance ratio (RRR).

Of course, the invention is not limited to the embodiments described and shown, but lends itself to many variants that will be evident to the person skilled in the art and that do not depart from the scope of the invention. In particular, any method known in itself of manufacturing multifilament superconductors can be used without departing from the scope of the present invention.

We claim:

1. Method of manufacturing a superconductor (1), having a copper outer ring (4), in N drawing stages comprising:

performing N–1 successive stages of billeting and drawing to manufacture a multifilament superconductor of a substance based on Nb;

performing an Nth stage of forming the superconductor to the final size, which includes:

disposing a distal hollow cylinder (6) coaxially with an intermediate hollow cylinder (5) and a proximal hollow cylinder (7) to thereby constitute a composite hollow cylinder (14), wherein said distal hollow cylinder (6) and said proximal hollow cylinder (7) are made from the same material as the outer ring, and said intermediate cylinder is made of a resistive barrier material;

filling said composite hollow cylinder (14) in an ordered manner with rods (15), obtained from the multifilament superconductor (13) obtained from the (N–1)th stage of the method, to produce a billet;

closing the ends of the billet and evacuating the interior of the billet; and drawing the billet to the required diameter of the superconductor (1).

2. Method according to claim 1, further comprising choosing the thicknesses of the hollow cylinders (5, 6, 7) so that, after drawing, the superconductor (1) has a resistive barrier having a predetermined thickness and a predetermined location in the outer ring (4).

3. Method according to claim 1, further comprising choosing the thicknesses of the hollow cylinders (5, 6, 7), and choosing the composition of the resistive barrier material of intermediate hollow cylinder (5) so as to obtain a predetermined ratio of the losses between superconductors to the losses between the filaments.

4. Method according to any one of claims 1 to 3, further comprising choosing the thicknesses of the hollow cylinders (5, 6, 7), and choosing the composition of the resistive barrier material of intermediate hollow cylinder (5) so as to obtain a predetermined residual resistance ratio (RRR).

5. Method according to claim 2, further comprising choosing the thicknesses of the hollow cylinders (5, 6, 7), and choosing the composition of the resistive barrier material of intermediate hollow cylinder (5) so as to obtain a predetermined ratio of the losses between superconductors to the losses between the filaments.

6. Method according to claim 5, further comprising choosing the thicknesses of the hollow cylinders (5, 6, 7), and choosing the composition of the resistive barrier material of intermediate hollow cylinder (5) so as to obtain a predetermined residual resistance ratio (RRR).

7. A method of manufacturing a superconductor, comprising:

disposing a distal hollow cylinder, which has a first diameter, coaxially with an intermediate hollow cylinder and a proximal hollow cylinder to thereby form a composite hollow cylinder, wherein said distal hollow cylinder and said proximal hollow cylinder are both made from a first material, and said intermediate cylinder is made of a resistive barrier material;

filling said composite hollow cylinder with multifilament superconductor rods, to produce a billet;

closing the ends of the billet and evacuating the interior of the billet; and drawing the billet to a second diameter which is smaller than said first diameter.

8. Method according to claim 7, wherein said first material is copper.

9. Method according to claim 7, wherein said multifilament superconductor rods include Nb.

10. Method according to claim 9, wherein said multifilament superconductor rods include Cu.

11. Method according to claim 7, wherein said multifilament superconductor rods are hexagonal in cross section.

12. Method according to claim 7, further comprising choosing the thicknesses of the hollow cylinders so that, after drawing, the superconductor has a resistive barrier having a predetermined thickness and a predetermined location with respect to said second diameter.

13. Method according to claim 7, further comprising choosing the thicknesses of the hollow cylinders, and choosing the composition of the resistive barrier material of intermediate hollow cylinder so as to obtain a predetermined ratio of the losses between superconductors to the losses between the filaments.

14. Method according to claim 7, further comprising choosing the thicknesses of the hollow cylinders, and choosing the composition of the resistive barrier material of intermediate hollow cylinder so as to obtain a predetermined residual resistance ratio (RRR).

* * * * *